(12) United States Patent
Takihara et al.

(10) Patent No.: US 9,523,613 B2
(45) Date of Patent: Dec. 20, 2016

(54) TEMPERATURE DETECTING CIRCUIT AND TEMPERATURE DETECTING APPARATUS USING THE SAME

(71) Applicant: Rohm Co., Ltd., Kyoto (JP)

(72) Inventors: Hirotaka Takihara, Kyoto (JP); Shintaro Takahashi, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 14/585,355

(22) Filed: Dec. 30, 2014

(65) Prior Publication Data

US 2015/0117492 A1 Apr. 30, 2015

Related U.S. Application Data

(62) Division of application No. 13/436,042, filed on Mar. 30, 2012, now abandoned.

(30) Foreign Application Priority Data

Apr. 1, 2011 (JP) .................................. 2011-81795
Apr. 4, 2011 (JP) .................................. 2011-82673
(Continued)

(51) Int. Cl.
*G01K 13/00* (2006.01)
*H05K 7/20* (2006.01)
(Continued)

(52) U.S. Cl.
CPC . *G01K 7/00* (2013.01); *G01K 1/02* (2013.01); *H02M 1/32* (2013.01);
(Continued)

(58) Field of Classification Search
USPC .................................................. 320/150, 151
See application file for complete search history.

(56) References Cited

U.S. PATENT DOCUMENTS 5,936,820 A * 8/1999 Umemura ............. B60L 3/0023
361/103
7,262,570 B2 8/2007 Alberkrack et al.
(Continued)

FOREIGN PATENT DOCUMENTS

JP 05-137255 6/1993
JP H09-008624 1/1997
(Continued)

OTHER PUBLICATIONS

Japanese Patent Office, Communication in counterpart JP Application No. 2012-052530, dated May 27, 2016 (with machine-translation).

*Primary Examiner* — Nasir U Ahmed
(74) *Attorney, Agent, or Firm* — Fish & Richardson P.C.

(57) ABSTRACT

A temperature detecting apparatus includes a temperature detecting circuit configured to output a first pulse signal according to a temperature detected by a temperature sensor, and an insulating transformer configured to transmit the first pulse signal to an integrated circuit which is operated by an operation voltage different from that of the temperature detecting circuit. The insulating transformer is installed between the temperature detecting circuit and the integrated circuit. The temperature detecting circuit and the insulating transformer are mounted on a common substrate.

15 Claims, 11 Drawing Sheets

(30) Foreign Application Priority Data

Apr. 4, 2011 (JP) .................................. 2011-82674
Mar. 9, 2012 (JP) .................................. 2012-52530

(51) Int. Cl.

| | | |
|---|---|---|
| *G01K 7/00* | (2006.01) | |
| *H02M 1/32* | (2007.01) | |
| *G01K 1/02* | (2006.01) | |
| *H02M 7/5387* | (2007.01) | |
| *H03K 17/08* | (2006.01) | |

(52) U.S. Cl.

CPC . *H01L 2924/0002* (2013.01); *H02M 7/53871* (2013.01); *H02M 2001/327* (2013.01); *H03K 2017/0806* (2013.01)

(56) References Cited

U.S. PATENT DOCUMENTS

| | | | |
|---|---|---|---|
| 7,622,887 B2 * | 11/2009 | Yoshimura | H01F 19/08 318/810 |
| 2002/0017919 A1 * | 2/2002 | Haigh | H04L 25/493 326/82 |
| 2005/0176184 A1 * | 8/2005 | Okihara | H01L 21/84 438/151 |
| 2006/0238154 A1 | 10/2006 | Brannen et al. | |
| 2011/0279975 A1 * | 11/2011 | Shimizu | H02P 7/29 361/695 |

FOREIGN PATENT DOCUMENTS

| | | |
|---|---|---|
| JP | 2007-165343 | 6/2007 |
| JP | 2009-130967 | 6/2009 |
| JP | 2009-147564 | 7/2009 |
| JP | 2009-232637 | 10/2009 |
| JP | 2010-199490 | 9/2010 |
| JP | 2011-007580 | 1/2011 |

* cited by examiner

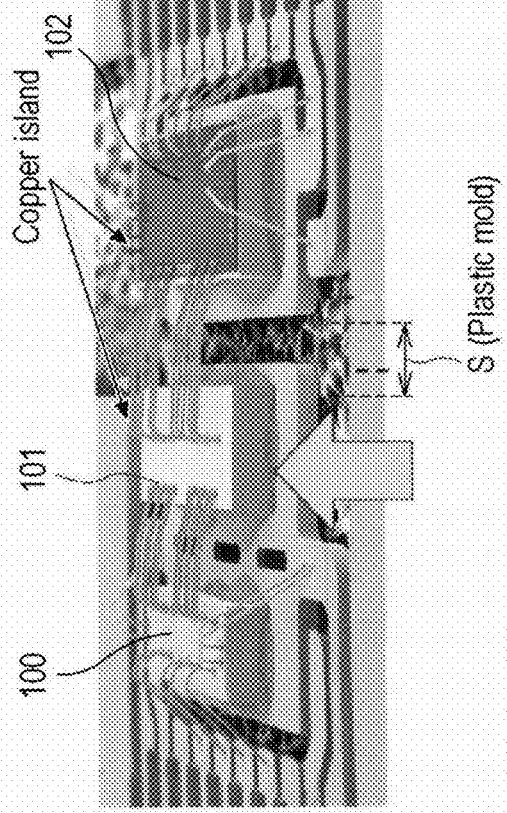
FIG. 4A
FIG. 4B
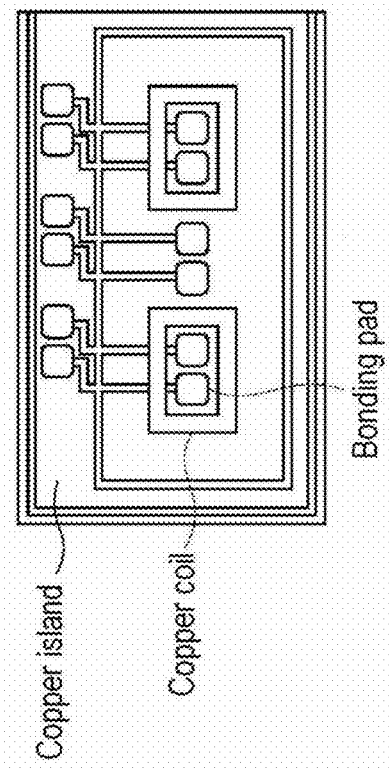
FIG. 4C

TEMPERATURE DETECTING CIRCUIT AND TEMPERATURE DETECTING APPARATUS USING THE SAME

CROSS-REFERENCE TO RELATED APPLICATIONS

This application is a divisional of U.S. patent application Ser. No. 13/436,042 filed Mar. 30, 2012, which claims the benefit of priority from Japanese Patent Application Nos. 2011-81795, filed on Apr. 1, 2011; 2011-82673, filed on Apr. 4, 2011; 2011-82674, filed on Apr. 4, 2011; and 2012-52530, filed on Mar. 9, 2012, the entire contents of which are incorporated herein by reference.

TECHNICAL FIELD

The present disclosure relates to a temperature detecting apparatus, a temperature detecting circuit, and a power semiconductor module, and more particularly, to a temperature detecting apparatus of a switching element constituting an inverter device, a temperature detecting circuit of a switching element constituting an inverter device, and a power semiconductor module including a temperature detection diode for detecting a temperature of a power switching element.

BACKGROUND

An electric motor combined with an engine is used as a power source of a hybrid automobile, electric automobile, etc. When the electric motor is driven, an inverter is used to obtain a predetermined torque frequency. The inverter is assembled within an automobile and is required to be small with high power in order to secure space for passengers.

An operation temperature of the inverter greatly changes according to the driving environment of the automobile, and in particular, in case of an automobile including an inverter mounted in an engine compartment, the inverter has a high temperature due to an influence of heat generated from the engine. In addition to the influence of ambient temperature, a switching element within the inverter may cause the temperature to rise due to an influence of a normal loss caused from a current flowing to the switching element itself and a switching loss caused from the turn-on and off of the switching element, and when the temperature exceeds a predetermined level, the switching element may be damaged.

Techniques for suppressing the rise of temperature have been already known.

For example, a photocoupler according to a related art includes a light emitting diode (LED) located at a transmitter and a photodiode placed at a receiver. The LED is disposed at a high voltage temperature detecting circuit and the photodiode is disposed at a low voltage substrate so that an operation voltage of the LED and that of the photodiode are different, the LED and photodiode cannot be manufactured on a common substrate, and it is difficult to form the LED and photodiode on an identical package.

Further, in another related art, a circuit for generating an analog triangular wave is affected by a change in temperature in the outer environment, a change in a power source voltage, etc. Thus, since the circuit cannot generate a stable analog triangular waveform, a problem arises in that precision of a duty cycle of an output pulse signal output from a comparator cannot be improved.

Further, in still another related art, an inverter circuit and a diode for detecting temperature are mounted on an identical substrate and made into a chip. When an IGBT (Insulated Gate Bipolar transistor) of the inverter circuit operates, temperature detection is performed. However, since the diode for detecting temperature and a temperature detecting circuit are formed as separate chips, detection precision is degraded due to an influence of non-uniformity of the semiconductor elements. Moreover, conventionally, in making chips with a silicon semiconductor, a usage limitation temperature (junction temperature) is 150 degrees Celsius, so it is difficult to form the diode for detecting temperature and the temperature detecting circuit as one chip.

SUMMARY

The present disclosure provides some embodiments of a temperature detecting apparatus capable of forming a temperature detecting circuit and an insulating element on the same substrate and reducing the size of an overall apparatus.

Further, the present disclosure provides some embodiments of a temperature detecting circuit capable of increasing a degree of precision of a duty cycle with an output pulse signal configured to control a temperature rise, etc.

In addition, the present disclosure provides some embodiments of a power semiconductor module capable of forming a diode configured to detect temperature and a temperature detecting circuit as one chip and increasing the degree of precision in detecting the temperature.

According to one aspect of the present disclosure, there is provided a temperature detecting apparatus. The temperature detecting apparatus includes a temperature detecting circuit configured to output a first pulse signal according to a temperature detected by a temperature sensor; and an insulating transformer configured to transmit the first pulse signal to an integrated circuit which is operated at an operation voltage different from that of the temperature detecting circuit. The insulating transformer is installed between the temperature detecting circuit and the integrated circuit. In this configuration, the temperature detecting circuit and the insulating transformer are mounted on a common substrate.

According to another aspect of the present disclosure, there is provided a temperature detecting circuit. The temperature detecting circuit includes an AD conversion circuit configured to convert a temperature detection signal from a temperature sensor into a digital temperature detection signal, a triangular wave generation circuit configured to output a digital signal equivalent to a triangular waveform as a time series, and a comparator configured to compare the digital temperature detection signal output from the AD conversion circuit and the digital signal output from the triangular wave generation circuit and output a signal with a duty cycle.

According to still another aspect of the present disclosure, there is provided a power semiconductor module. The power semiconductor module includes a power element circuit configured by a power switching element, a temperature detecting diode configured to measure a temperature of the power switching element, and a temperature detecting circuit configured to detect a temperature by a voltage signal from the temperature detecting diode. With this configuration, the temperature detecting diode and the temperature detecting circuit are formed on a single chip as an SOI structure.

BRIEF DESCRIPTION OF THE DRAWINGS

FIGS. 4A to 4C are views illustrating a mounted state of circuit elements of the temperature detecting apparatus of the first embodiment.

DETAILED DESCRIPTION

Figure 1:
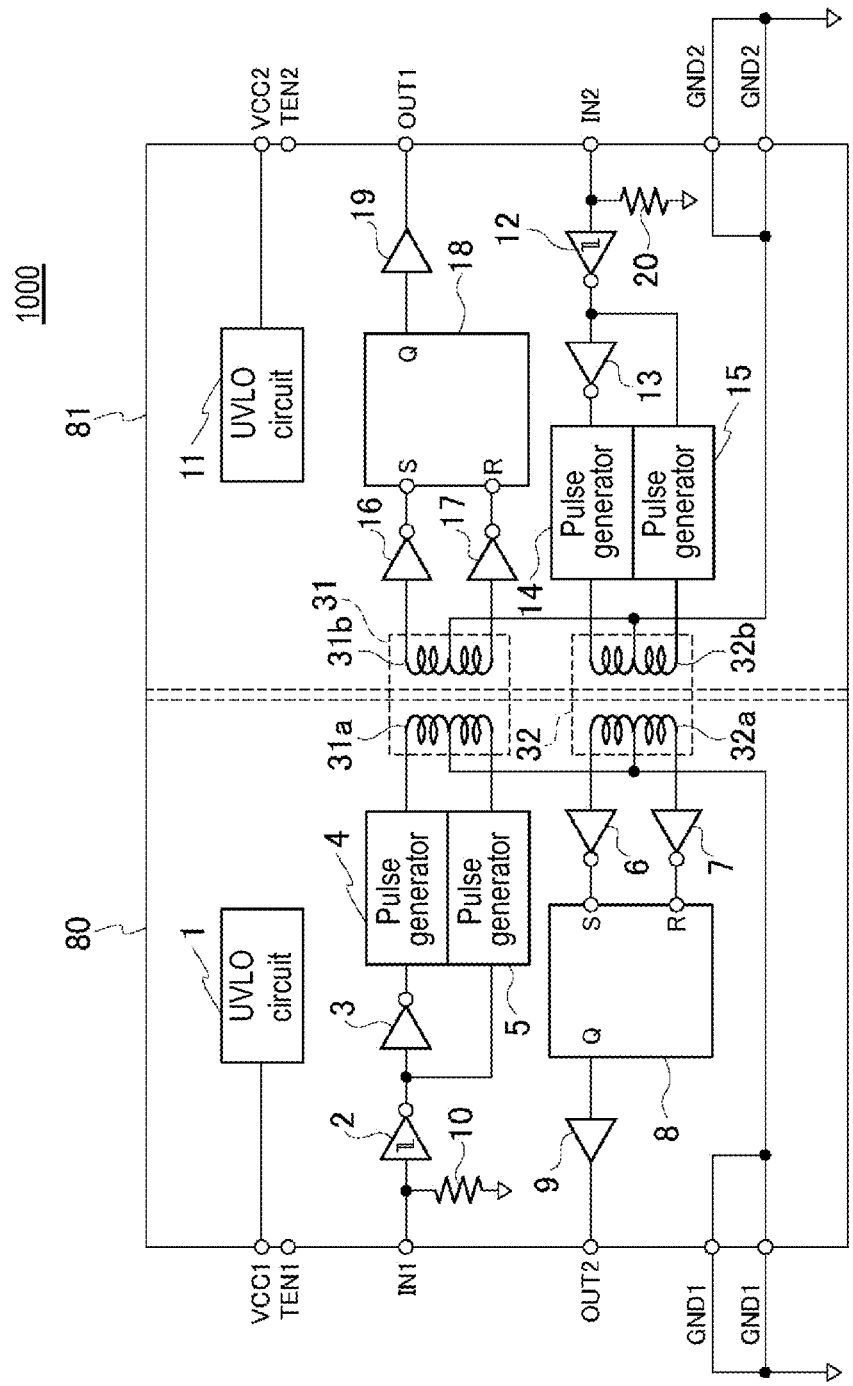
FIG. 1 is a view illustrating a circuit configuration of an insulating signal transmission circuit used in a temperature detecting apparatus of a first embodiment.

Embodiments of the present disclosure will now be described with reference to the accompanying drawings. In the following description, regarding the drawings, like or similar reference numerals are used for like or similar parts. However, the drawings are schematic and it should be noted that the relationships between thickness and planar dimensions, rates of thicknesses of respective layers or the like are different from real ones. Thus, specific thicknesses or dimensions should be determined in consideration of the following description. Further, parts in which mutual dimension relationships or rates are different are included in mutual drawings.

Also, embodiments described hereinafter exemplify an apparatus or a method for embodying a technical concept of the present disclosure, and in embodiments of the present disclosure, materials, configurations, depositions and the like of constituent elements are not specified to those described hereinafter. The embodiments of the present disclosure may be variably modified in the scope of claims.

First Embodiment

Hereinafter, a first embodiment of the present disclosure will be described in detail with reference to FIGS. 1 to 6.

A temperature detecting apparatus of the first embodiment includes a temperature detecting circuit 76 (shown in FIG. 5) configured to output a first pulse signal according to a temperature detected by a temperature sensor 35 (shown in FIG. 2), and insulating transformers 70 and 71 (shown in FIG. 2) configured to transmit the first pulse signal to an integrating circuit which operates at an operation voltage different from that of the temperature detecting circuit 76. The insulating transformers 70 and 71 are installed between the temperature detecting circuit 76 and the integrated circuit. The temperature detecting circuit 76 and the insulating transformers 70 and 71 are mounted on a common substrate.

In the insulating transformers 70 and 71, primary coils 70a and 71a through which currents flow based on the first pulse signal from the temperature detecting circuit 76, and secondary coils 70b and 71b which are configured to generate a current to be transmitted to the integrated circuit may be formed at upper and lower portions of the insulating transformers 70 and 71 with a dielectric layer interposed therebetween.

Further, the temperature detecting circuit 76 outputs a second pulse signal when the temperature detected by the temperature sensor 35 reaches a predetermined limit value, and the insulating transformers 70 and 71 are configured to transmit the second pulse signal from the temperature detecting circuit 76 to the integrated circuit.

Pulse generators 4 and 5, which shape pulse widths of a high level and a low level of the first pulse signal or the second pulse signal, generate a pulse having a width smaller than those of the pulse signals and output the same, are installed in the vicinity of the primary coils of the insulating transformers 70 and 71.

A signal demodulation circuit, which is configured to demodulate a pulse signal having a waveform shaped by the pulse generators 4 and 5 into a signal having the original pulse width, may be configured behind the secondary coil of the insulating transformers 70 and 71, which are configured to generate a current to be transmitted to the integrated circuit.

An insulating signal transmission circuit 1000 illustrated in FIG. 1 includes a primary circuit 80 and a secondary circuit 81.

The insulating signal transmission circuit 1000 executes the transmission of a signal from the primary circuit 80 to the secondary circuit 81 and conversely executes the transmission of a signal from the secondary circuit 81 to the primary circuit 80, as well as executing insulation between the primary circuit 80 and the secondary circuit 81. Thus, a circuit for controlling a signal transmission is included in the insulating signal transmission circuit 1000. Further, in an actual device, for example, the primary circuit 80 may be used as a high voltage circuit and the secondary circuit 81 may be used as a low voltage circuit.

The primary circuit 80 and the secondary circuit 81 are configured as symmetrical circuits, and here, the primary circuit 80 may be used as a low voltage circuit and the secondary circuit 81 may be used as a high voltage circuit.

The primary circuit 80 includes a UVLO (Undervoltage-Lockout; low voltage malfunction preventing) circuit 1, inverters 2, 3, 6, and 7, the pulse generators 4 and 5, an RS flip-flop 8, a buffer 9, and a resistor 10. The inverter 2 and the resistor 10 may function as a buffer. The UVLO (low voltage malfunction preventing) circuit 1 monitors a power source voltage VCC1. When the power source voltage VCC1 is lower than a predetermined voltage, the UVLO (low voltage malfunction preventing) circuit 1 stops the pulse generators 4 and 5 or the RS flip-flop 8 and locks out an operation of stopping input/output signals. Further, when the power source voltage VCC1 is returned to have a normal voltage value, the UVLO circuit 1 is released to start a normal operation.

Insulting transformers 31 and 32 are installed to link the primary circuit 80 and the secondary circuit 81. The insulating transformer 31 is composed of an inductor 31a and an inductor 31b insulated from the inductor 31a. The insulating transformer 32 is composed of an inductor 32a and an inductor 32b insulated from the inductor 32a.

The insulating transformer 31, insulating the primary circuit 80 and the secondary circuit 81, transmits a signal from the primary circuit 80 to the secondary circuit 81. Similarly, the insulating transformer 32 transmits a signal from the secondary circuit 81 to the primary circuit 80, even while insulating the primary circuit 80 and the secondary circuit 81.

The secondary circuit 81 includes a UVLO (low voltage malfunction preventing) circuit 11, inverters 12 and 13, pulse generators 14 and 15, inverters 16 and 17, an RS flip-flop 18, a buffer 19, and a resistor 20.

The inverter 12 and the resistor 20 also achieve the role of a buffer. The UVLO (low voltage malfunction preventing) circuit 11 monitors a power source voltage VCC2, and its operation is the same as that of the UVLO circuit 1, so a description thereof will be omitted.

When a square-wave pulse signal input to a terminal IN1 of the primary circuit 80 is transmitted as is to the secondary circuit 81 through the insulating transformer 31, a current corresponding to time of a pulse width of the pulse signal flows to the insulating transformer 31. Thus, if the pulse width becomes long, power consumption increases. In order to prevent the increase of power consumption, the pulse generators 4 and 5 shape the input pulse signal such that a pulse width thereof is narrowed, and output the shaped pulse signal. Since the pulse signal is formed to have high and low level pulses being alternated, the pulse generator 4 configured to narrow the high level pulse width and the pulse generator 5 configured to narrow the low level pulse width are installed.

Similarly, when a square-wave pulse signal input to a terminal IN2 of the secondary circuit 81 is transmitted as is to the primary circuit 80 through the insulating transformer 32, a current corresponding to time of a pulse width of the pulse signal flows to the insulating transformer 32. Thus, if the pulse width becomes longer, power consumption increases. In order to prevent the increase of power consumption, the pulse generators 14 and 15 shape the input pulse signal such that a pulse width thereof is narrowed, and output the shaped pulse signal. The pulse generator 14 configured to narrow the high level pulse width and the pulse generator 15 configured to narrow the low level pulse width are installed.

Here, the pulse generators 4, 5, 14, and 15 generate a pulse having a width narrower than that of the original signal by using the rise of the pulse signal as a trigger, and all of the pulse generators may have the same circuit configuration. The primary circuit 80 is configured to be grounded at GND1, and the secondary circuit 81 is configured to be grounded at the GND2. The primary circuit 80 and the secondary circuit 81 are not configured to have a common ground line, so a ground potential of the primary circuit 80 and that of the secondary circuit 81 are different.

Next, an operation of the insulating signal transmission circuit 1000 will be described. The pulse signal input to the terminal IN1 of the primary circuit 80 is inverted in the inverter 2. The inverted signal is input to the pulse generator 5. The pulse generator 5 generates a pulse having a width narrower than that of the original pulse signal by using the rise of the inverted signal as a trigger, and then outputs the pulse to the primary inductor 31a of the insulating transformer 31. Due to a change in current in response to the pulse supplied to the primary inductor 31a of the insulating transformer 31, a current is generated from the secondary inductor 31b of the insulating transformer 31, and then supplied to the RS flip-flop 18 through the inverters 16 and 17.

Whether a high level signal is to be input to a terminal S or to a terminal R of the RS flip-flop 18 is determined by a direction of the current flowing across the secondary inductor 31b. In this case, a high level signal is input to the terminal R of the RS flip-flop 18 and a low level signal is input to the terminal S, and an output Q has a low level signal. The low level signal from the output Q is output to OUT1 through the buffer 19.

Since the pulse supplied to the primary inductor 31a of the insulating transformer 31 is based on the inverted signal of the pulse signal input to the terminal IN1, the pulse was generated in response to the drop of the pulse signal input to the terminal IN1. The insulating transformer 31 is operated based on a low level pulse of the pulse signal input to the terminal IN1 to generate a low level pulse in the RS flip-flop 18, and this causes the low level pulse portion of the pulse signal input to the terminal IN1 to be demodulated.

Meanwhile, the inverted signal which was inverted in the inverter 2 is again inverted in the inverter 3 so as to be returned to its original state, that is, the state of the pulse signal which was input to the terminal IN1. By using the rise of the pulse signal as a trigger, the pulse generator 4 generates a pulse having a width narrower than that of the original signal and outputs the pulse to the primary inductor 31a of the insulating transformer 31. Due to a change in current according to the pulse supplied to the primary inductor 31a of the insulating transformer 31, a current is generated from the secondary inductor 31b of the insulating transformer 31, and then supplied to the RS flip-flop 18 through the inverters 16 and 17.

In this case, when a pulse is generated from the pulse generator 4, the direction of the current flowing across the primary inductor 31a is opposite, so the direction of the current flowing across the secondary inductor 31b is also opposite. Also, a high level signal is input to the terminal S of the RS flip-flop 18 and a low level signal is input to the terminal R, so that the output Q has a high level signal. The high level signal from the output Q is output to OUT1 through the buffer 19.

In the above description, the insulating transformer 31 is operated based on the high level pulse of the pulse signal input to the terminal IN1, and a high level pulse is generated from the RS flip-flop 18, which causes the high level pulse portion of the pulse signal input to the terminal IN1 to be demodulated.

In this manner, by using the pulse generators 4 and 5, the RS flip-flop 18, etc., the pulse signal input to the primary circuit 80 can be demodulated by the secondary circuit 81, while restraining power consumption for driving the insulating transformer 31.

Meanwhile, an operation of transmitting a pulse signal input to IN2 of the secondary circuit 81 to OUT2 of the primary circuit 80 through the pulse generators 14 and 15, the RS flip-flop 8 and the like is the same as the operation of transmitting the pulse signal input to IN1 as described above, so a description thereof will be omitted.

Figure 6:
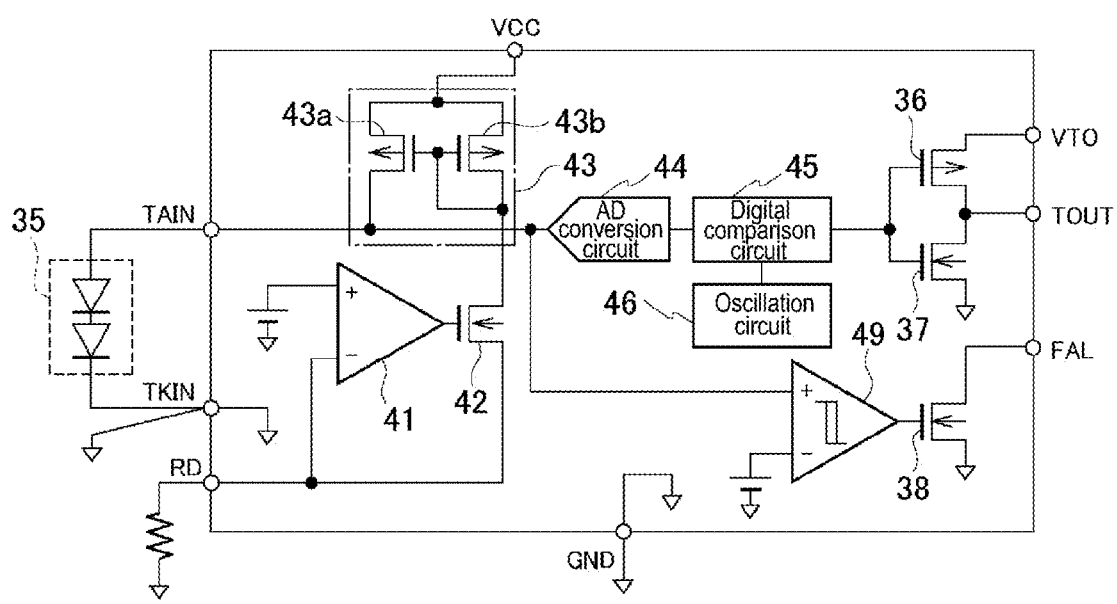
FIG. 6 is a view illustrating a circuit configuration example of a temperature detecting circuit of the first embodiment.

Next, an example of a configuration of the temperature detecting circuit will be described with reference to FIG. 6. First, the external temperature sensor 35 is configured to include two diodes connected in series. The temperature sensor 35 is installed in the vicinity of a switching element such as a power transistor. In the present embodiment, in which the temperature sensor 35 is configured as diodes, the diodes as a temperature sensor has the characteristic that a forward voltage is reduced when the temperature is increased under a condition of a constant current. The temperature of a switching element such as a power transistor may be measured by supplying a predetermined current to the diode and measuring a forward voltage.

As described above, since there is a need to make a constant current flow to the diodes of the temperature sensor 35, a constant current source includes an amplifier 41 functioning as an operational amplifier, a FET 42, and a current mirror circuit 43. The current mirror circuit 43 includes P type MOSFETs 43a and 43b. A gate of the FET 43a and a gate of the FET 43b are connected, and a drain of the FET 43a and a drain of the FET 43b are also connected. The FET 43b is also connected to a diode.

If a current flowing between the drain and a source of the FET 43b is determined, a current flowing between the drain and a source of the FET 43a is also determined. The amplifier 41 and the N type MOSFET 42 constitute a power amplifier.

A temperature detection voltage TAIN detected by the temperature sensor 35 is input to an AD conversion circuit 44. The AD conversion circuit 44 is configured as a so-called sequential comparison AD conversion circuit. The TAIN signal converted into a digital value in the AD conversion circuit 44 is input to a digital comparison circuit 45.

The digital comparison circuit 45 is configured as a counter, a digital comparator, or the like. An oscillation circuit 46 generates a clock pulse of a predetermined frequency, and the clocks from the oscillation circuit 46 are counted by a counter within the digital comparison circuit 45 to generate a digital triangular signal. The digital comparison circuit 45 includes a digital comparator to compare the digital triangular signal and the TAIN signal which has been converted into a digital value. When the TAIN signal having a digital value is greater than the digital triangular signal, the digital comparison circuit 45 outputs a high level signal. When the TAIN signal having a digital value is smaller than the digital triangular signal, the digital comparison circuit 45 outputs a low level signal.

The output signal from the digital comparison circuit 45 is then output to an inverter circuit. The inverter circuit includes an N type MOSFET 37 and a P type MOSFET 36. A source of the FET 36 and a drain of the FET 37 are connected, and a gate of the FET 36 and a gate of the FET 37 are also connected. An output signal from the digital comparison circuit 45 is input to the gate of the FET 36 and the gate of the FET 37.

The output signal from the digital comparison circuit 45 is inverted by the inverter according to the FETs 36 and 37 so as to be output as a TOUT signal. Further, a signal of a terminal VTO indicates a high level value of the TOUT signal. Thus, the size of the temperature from the temperature sensor 35 is detected by a pulse width of the TOUT signal or by a signal with a duty cycle.

Here, a FAL signal also included in a connection terminal will be described. The FAL signal indicates that the temperature detected by the temperature sensor 35 is considerably high, while the temperature detection voltage signal TAIN is extremely low. That is, the FAL signal is generated when the temperature detected by the temperature sensor 35 reaches a limit value.

A DC power source is connected to a minus terminal of a comparator 49. A voltage value of the DC power source is set to be a voltage corresponding to the limit value of the temperature. Meanwhile, the temperature detection voltage signal TAIN is input to a plus terminal of the comparator 49. When the temperature detection voltage signal TAIN is higher than a voltage value of the DC power source, a high level signal is output from the comparator 49. The high level signal from the comparator 49 is input to the gate of an N type MOSFET 38. Accordingly, the FET 38 is turned on and the FAL terminal has a low level.

Meanwhile, when the detected temperature is decreased and so the temperature detection voltage signal TAIN becomes lower than the voltage value of the DC power source, the output from the comparator 49 is reversed into a low level signal. The low level signal from the comparator 49 is input to the gate of the N type MOSFET 38. Accordingly, the FET 38 is turned off and the FAL terminal has a high level. In this manner, it is detected that a temperature rise of the temperature detection target has reached a limit. The FAL signal is transmitted to an external control device or the like, and used as a control signal for stopping an operation of the temperature detection target, etc.

Figure 2:
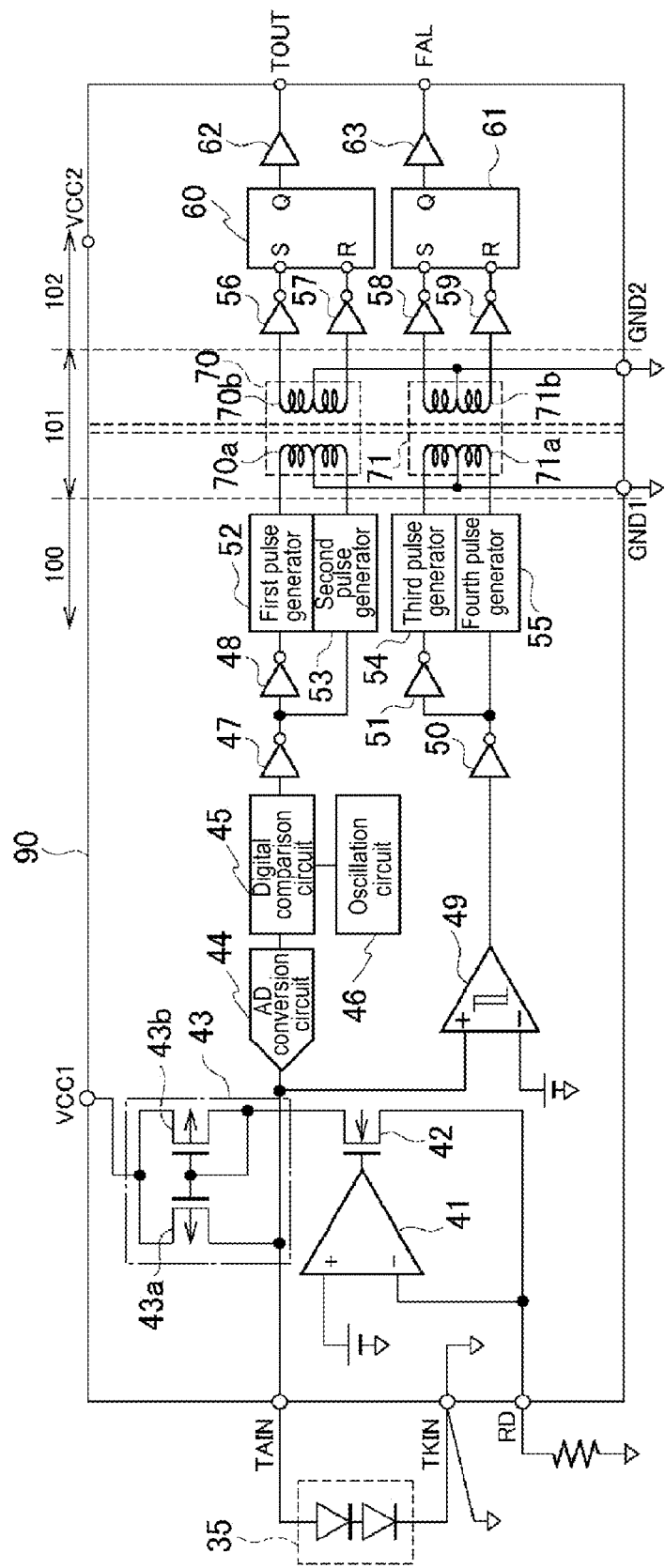
FIG. 2 is a view illustrating a circuit configuration of the temperature detecting apparatus of the first embodiment.
Figure 5:
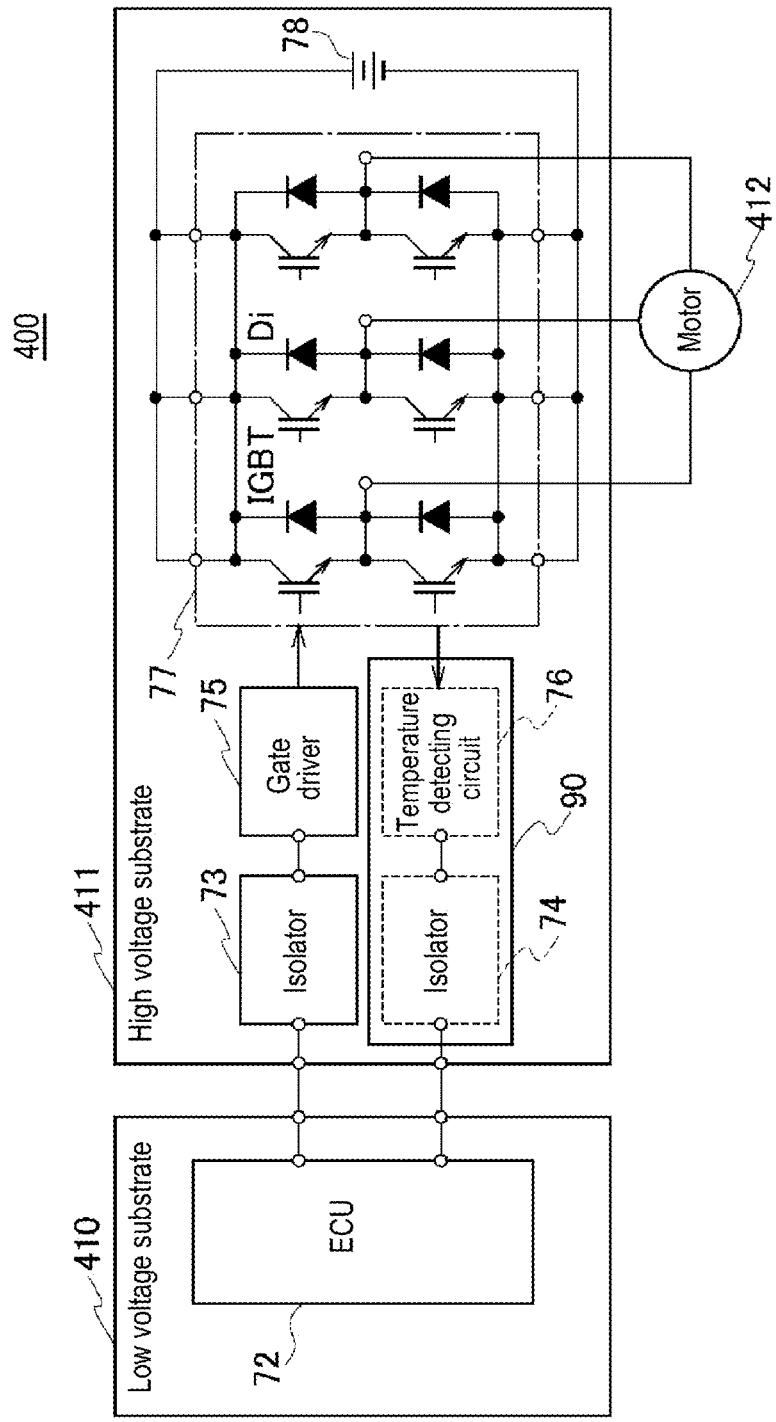
FIG. 5 is a view illustrating a configuration example of a device using the temperature detecting apparatus of the first embodiment.

A temperature detecting apparatus 90 of FIG. 2 is configured by combining the insulating signal transmission circuit 1000 of FIG. 1 and the temperature detecting circuit 76 of FIG. 5. Circuit elements denoted by the same reference numerals as those of the temperature detecting circuit of FIG. 6 perform the same operations as those of the circuits of FIG. 5, so a description of the temperature detecting circuit as a high voltage side circuit will be omitted.

In the temperature detecting apparatus in FIG. 2, unlike the insulating signal transmission circuit 1000 of FIG. 1, a bi-directional signal transmission is not performed between the primary circuit and the second circuit separated in an insulating transformer circuit 101, and a uni-directional signal is transmitted from the temperature detecting circuit 100 to a signal demodulation circuit 102.

Thus, in order to restrain power consumption of the insulating transformers 31 and 32 as described above with reference to FIG. 1, a pulse generator which shapes an input pulse signal such that it has a narrow pulse width and outputs the pulse signal is installed only in the temperature detecting circuit 100. Also, the signals output from the temperature detecting circuit 100 are two types of signals, namely, a TOUT signal as a temperature detection signal and a FAL signal indicating that the temperature has reached a limit temperature. As for a signal transmission path of single type signal, as described above with reference to FIG. 1, a pulse generator for narrowing a pulse width of a high level of the input pulse signal and a pulse generator for narrowing a pulse width of a low level of the input pulse signal are required.

For this reason, as shown in FIG. 2, a first pulse generator 52 and a second pulse generator 53 are installed so that they transmit the pulse signal corresponding to the detected temperature output from the digital comparison circuit 45. Further, a third pulse generator 54 and a fourth pulse generator 55 are installed for transmitting the FAL signal, which indicates that the temperature has reached a limit temperature output from the comparator 49.

The configurations in FIGS. 1 and 2 may correspond to each other as follows. The inverter 2 in FIG. 1 corresponds to an inverter 47 in FIG. 2, the inverter 3 corresponds to an inverter 48, the pulse generator 4 corresponds to the first pulse generator 52, the pulse generator 5 corresponds to the second pulse generator 53, the insulating transformer 31 corresponds to the insulating transformer 70, the inverter 16 corresponds to an inverter 56, the inverter 17 corresponds to an inverter 57, the RS flip-flop 18 corresponds to an RS flip-flop 60, and the buffer 19 corresponds to a buffer 62.

Thus, since the operation of FIG. 2 is the same as that of FIG. 1 as described above, a description of the corresponding circuits of FIG. 2 and a description of the signal demodulation circuit 102 will be omitted. Further, an inverter 50, an inverter 51, the third pulse generator 54, the fourth pulse generator 55, the insulating transformer 71, an inverter 58, an inverter 59, an RS flip-flop 61, and a buffer 63, which constitute a signal system for transmitting and demodulating the FAL signal output from a comparator 49, are operated as described above, so a description thereof will also be omitted.

Here, the temperature detecting circuit 100 and the insulating transformer circuit 101 are formed on the same substrate (the same frame). The insulating transformer circuit 101, to which a power source voltage is not required to be supplied, can obtain a current signal according to a magnetic mutual induction, so the insulating transformer circuit 101 may use a common substrate with the temperature detecting circuit 100.

A state in which the temperature detecting apparatus of FIG. 2 as a package is mounted on the substrate is shown in FIGS. 4A to 4C.

FIG. 4A shows a photograph image of an interior viewed from a package surface. FIG. 4B is an enlarged photograph image of FIG. 4A, in which the object positioned at the center is equivalent to the insulating transformer circuit 101. Further, the object disposed at the left of the object positioned at the center is equivalent to the temperature detecting circuit 100, and the object disposed at the right of the object disposed at the center is equivalent to the signal demodulation circuit 102, both of which are opposite each other.

A plastic mold is formed at a portion S between the insulating transformer and the signal demodulation circuit.

The insulating transformer is configured as a chip and is formed on the same substrate on which the temperature detecting circuit is formed, and a copper island is formed on a rear surface thereof. FIG. 4C shows a structure projected from the rear surface on which the copper island is formed. A bonding pad is formed on the copper island, and a copper coil is formed at an inner side of the copper island.

Figure 3:
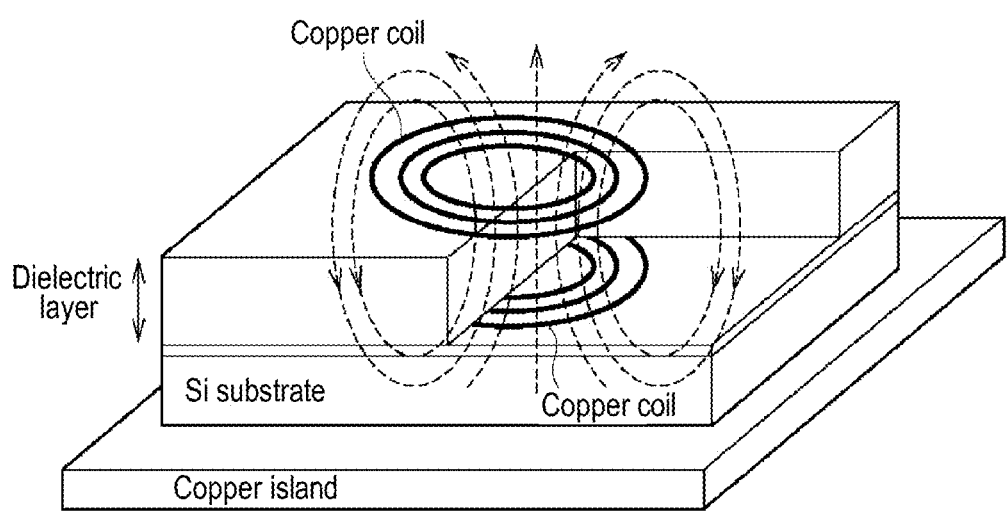
FIG. 3 is a view illustrating an example of an insulating transformer stacked structure disposed in the temperature detecting apparatus of the first embodiment.

A stacked structure of the insulating transformer formed as a chip is shown in FIG. 3.

A silicon (Si) substrate is formed on the copper island, and a primary or secondary copper coil is formed on the silicon substrate.

A dielectric layer made of $SiO_2$ or the like is stacked to cover the copper coil. A secondary or primary copper coil is formed on the dielectric layer. In this manner, the primary coil and the secondary coil are electrically insulated by the dielectric layer. FIG. 4C is a rear projected view of this.

Next, an example of a device to which the temperature detecting apparatus of the present embodiment is applied is shown in FIG. 5. FIG. 5 illustrates an example of a driving system apparatus 400 in which signals are transmitted in both directions between a low voltage substrate 410 and a high voltage substrate 411 of an automobile. The low voltage substrate 410 is mainly configured by an ECU 72. ECU is called an electronic control unit or an engine control unit, which executes controlling of an engine, controlling of a driving system or a steering system, etc., by a computer.

The high voltage substrate 411 includes a power semiconductor module 77 for driving a motor 412. An insulating gate bipolar transistor (IGBT) is illustrated as a power switching element of the power semiconductor module 77. A gate of each IGBT is connected to a gate driver 75.

A control signal output from the ECU 72 is transmitted to the gate driver 75 through an isolator 73. A driving signal from the gate driver 75 is output according to the control signal from the ECU 72. PWM (Pulse-width modulation) controlling is performed by the driving signal, and six IGBTs of the power semiconductor module 77 are turned on or off at a desired timing to generate 3-phase AC power for driving the motor 412.

Meanwhile, the temperature is detected by a temperature sensor (not shown) installed in the vicinity of the IGBTs of the power semiconductor module 77, and the detected signal is input to the temperature detecting circuit 76 and converted into a pulse signal so as to be output and transmitted to the ECU 72 through an isolator 74. In the related art, a photocoupler is used as an isolator, but in the present embodiment, an insulating transformer is used and a temperature detecting apparatus 90 formed by packaging a temperature detecting circuit 76 and the isolator 74 is used. The temperature detecting apparatus 90 of FIG. 5 is the temperature detecting apparatus 90 illustrated in FIG. 2.

Comparative Example

In a comparative example, in a vehicle system in which a vehicle body with a power switching element mounted therein is used for a reference potential, a low voltage substrate and a high voltage substrate are connected, the low voltage substrate and the high voltage substrate are insulated, and a power card is mounted on the high voltage substrate.

The power card is packaged by mounting a power switching element and a diode as a temperature sensor thereon.

With this configuration, the power switching element constitutes an inverter connected to a rotary electric machine used for running a vehicle. The rotary electric machine used for running a vehicle may be a rotary electric machine as a main machine for a vehicle, a generator for charging a high voltage battery for supplying power to the rotary electric machine as the main machine for a vehicle, etc. Meanwhile, the temperature sensor is disposed in the vicinity of the power switching element to detect the temperature.

Further, a temperature detecting circuit configured to change a temperature detection signal into a PWM signal is mounted on the high voltage substrate. The low voltage substrate and the high voltage substrate are insulated by a photocoupler, and the photocoupler is an insulating unit for transmitting a signal from one of the substrates to the other, while insulating both substrates.

In general, the photocoupler may be used as an insulating element for insulating the high voltage substrate and the low voltage substrate, so the photocoupler and the temperature detecting circuit are separately installed in a package, rather than being disposed on the same substrate.

Further, the photocoupler may include a light emitting diode (LED) of a transmission side and a photodiode of a reception side. The LED is disposed at the temperature detecting circuit of a high voltage side and the photodiode is disposed at a low voltage substrate. In this manner, an operation voltage of the LED and that of the photodiode are different and cannot be manufactured on a common substrate, and it is difficult to form the LED and the photodiode in the same package.

In the temperature detecting apparatus of the first embodiment, the insulating transformers 70 and 71 are formed between the temperature detecting circuit 100 for outputting the first pulse signal according to a temperature detected by the temperature sensor 35 and an integrated circuit operating at an operation voltage different from that of the temperature detecting circuit 100, and the first pulse signal is transmitted from the temperature detecting circuit 100 to the integrated circuit, while maintaining an insulating state between the insulating transformers 70 and 71.

In this manner, since the insulating transformers 70 and 71 are used, there is no need to supply different voltages to the insulating transformers 70 and 71, and a signal transmission according to a magnetic change is executed. Thus, the temperature detecting circuit 100 and the insulating transformers 70 and 71 can be mounted on a common substrate, and the apparatus can be reduced in size.

Second Embodiment

Figure 7:
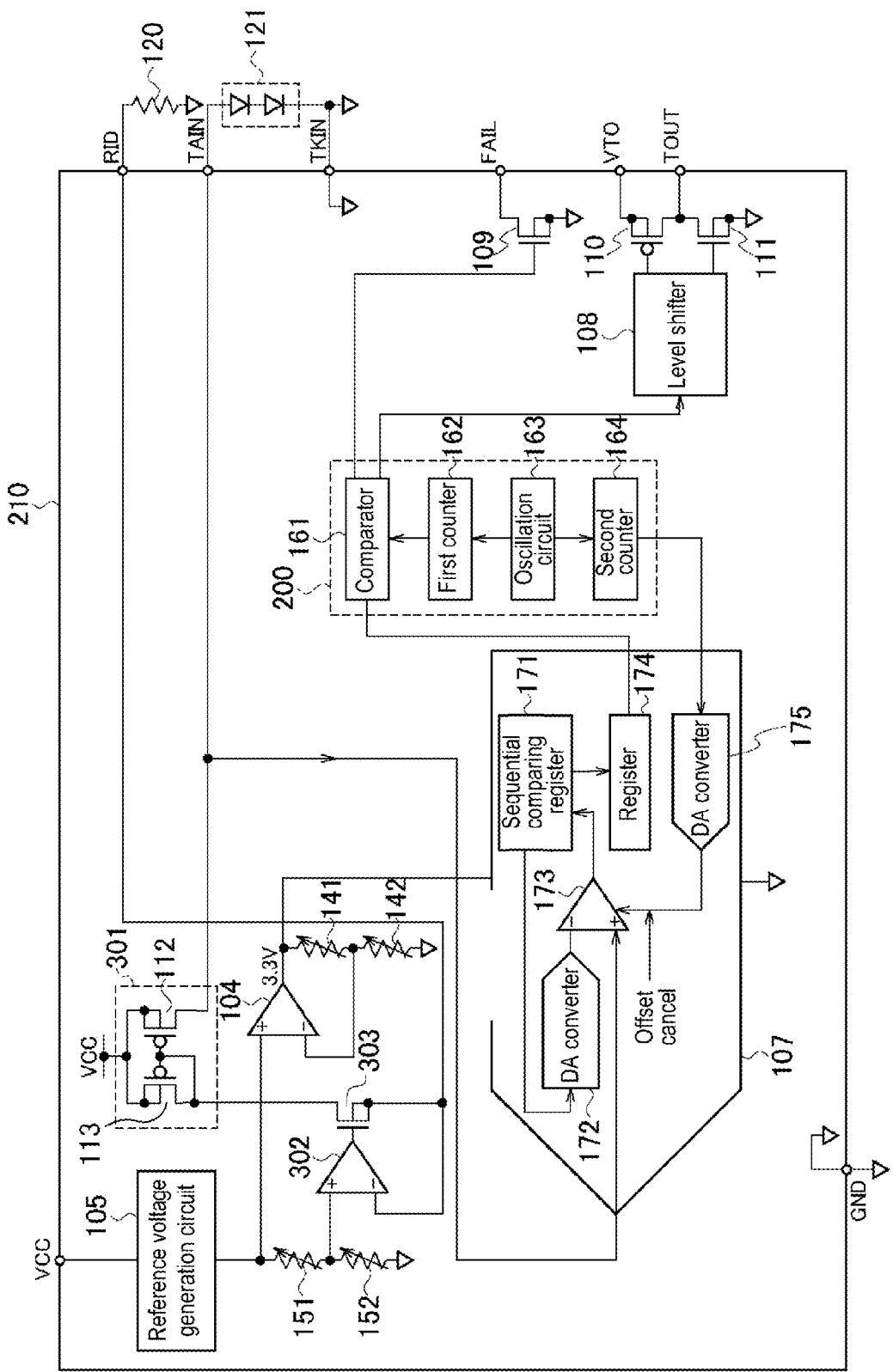
FIG. 7 is a view illustrating a circuit configuration of a temperature detecting circuit of a second embodiment.

Hereinafter, a second embodiment of the present disclosure will be described in detail with reference to FIGS. 7 and 8.

A temperature detecting circuit 201 of the second embodiment includes an AD conversion circuit 107, a triangular wave generation circuit (a first counter 162 and an oscillator circuit 163), and a comparator 161. The AD conversion circuit 107 is configured to convert a temperature detection signal from a temperature sensor 121 into a digital value. The triangular wave generation circuit is configured to output a digital signal equivalent to a triangular wave as a time series. The comparator 161 is configured to compare the digital temperature detection signal output from the AD conversion circuit 107 and the digital signal output from the triangular wave generation circuit. A signal with a duty cycle is output from the comparator 161.

A period for executing a comparison process in the comparator 161 includes four cycles, one cycle of which is defined as a section from a maximum value of the triangular wave to a next maximum value of the triangular wave or a section from a minimum value of the triangular wave to a next minimum value of the triangular wave.

Also, during one period in which the comparison process is executed, a duty ratio is determined by the first two cycles.

Further, when a temperature detected by the temperature sensor 121 reaches a limit value, a detection signal may be output from the comparator 161.

The temperature sensor 121 may include an element which operates with a constant current and has the voltage changing in response to a temperature.

Also, a constant current source, from which a current flows to the temperature sensor 121, is configured to include a current mirror circuit 301 and change the current flowing to a temperature sensor 121 based on a value of a resistor connected to the current mirror circuit 301.

In this configuration, for example, an external temperature sensor 121 is configured to include two diodes connected in series. The temperature sensor 121 is installed in the vicinity of a switching element such as a power transistor.

In the present embodiment, in the case in which the temperature sensor 121 is configured as diodes, the diodes as a temperature sensor has the characteristic that a forward voltage is reduced if the temperature is increased under a condition of a constant current. The temperature of a switching element such as a power transistor may be measured by supplying a predetermined current to the diode and measuring a forward voltage.

As described above, since there is a need to make a constant current flow to the diodes of the temperature sensor 121, a constant current source includes variable resistors 151 and 152, an amplifier 302 functioning as an operational amplifier, a FET 303, and the current mirror circuit 301.

A reference voltage generation circuit 105 functions to adjust a voltage required for a particular element within the temperature detecting circuit 210 from a power source voltage VCC, and to supply the same. For example, the reference voltage generation circuit 105 may be configured to generate an output voltage of 1.25V. The current mirror circuit 301 includes P type MOSFETs 112 and 113. A gate of the FET 112 and a gate of the FET 113 are connected, and a drain of the FET 112 and a drain of the FET 113 are also connected. The FET 113 is also connected to a diode.

If a current flowing between the drain and a source of the FET 113 is determined, a current flowing between the drain and a source of the FET 112 is also determined. The amplifier 302 and the N type MOSFET 303 constitute a power amplifier. A current flowing to the FET 113 may be changed by adjusting the variable resistors 151 and 152, and a current flowing to the diode of the temperature sensor 121 may also be changed.

Also, a ratio between the current flowing between the drain and the source of the FET 113 and the current flowing between the drain and the source of the FET 112 is determined by a ratio between the resistance of an external resistor 120 connected to the FET 303 and the internal resistance of the temperature sensor 121. For example, in an aspect where the internal resistance of the temperature sensor 121 is generally set to be about $\frac{1}{20}$ of that of the resistor 120, the current mirror circuit 301 functions as a constant current source for supplying a current of about 20 fold of the current flowing between the drain and the source of the FET 113 to the temperature sensor 121.

Meanwhile, the amplifier 104 functioning as an operational amplifier amplifies a voltage generated by the reference voltage generation circuit 105 and supplies the same to the AD conversion circuit 107. A variable resistor 141 is installed between a minus input terminal and an output terminal of the amplifier 104. Further, a variable resistor 142 installed between the minus input terminal of the amplifier 104 and GND is connected in series to the variable resistor 141. An output voltage of the amplifier 104 is adjusted by the variable resistors 141 and 142 and supplied to the AD conversion circuit 107. For example, as illustrated in the FIG. 7, it is set to be 3.3V.

Next, a comparison between a temperature detection voltage detected by the temperature sensor 121 and a triangular wave will be described. The AD conversion circuit 107 includes a sequential comparison register 171, a DA converter 172, an analog comparator 173, a register 174, and a DA converter 175. The AD conversion circuit 107 is a so-called sequential comparison AD conversion circuit. The sequential comparison register 171 is a register which sequentially creates approximate values continuously. First, if there is a command for starting conversion, the sequential comparison register 171 sets an MSB as 1. This result is D/A converted by the DA converter 172 so as to be returned to an analog amount and then compared with a temperature detection voltage in the comparator 173. In this case, if the voltage value of the temperature detection voltage is higher, the MSB remains as 1.

Next, the second bit of the sequential comparison register 171 is also set to be 1. This result is D/A converted by the DA converter 172 so as to be returned to an analog amount and compared with the temperature detection voltage in the comparator 173. If the temperature detection voltage is lower, the second bit of the sequential comparison register 171 is returned to 0. In this manner, the sequential bits are set and compared, starting from the MSB to an LSB, and if the bit is greater than the temperature detection voltage, the value is reset, and if it is smaller, the value remains as is, and this operation is continuously performed. If the operation continues up to the LSB, only a digital amount closest to the temperature detection voltage remains. The digital value is extracted and stored in the register 174.

Next, the digital signal of the temperature detection voltage retained in the register 174 is output to a digital comparison circuit 200. In the digital comparison circuit 200, every signal is processed into a digital signal.

The digital comparison circuit 200 includes the comparator 161, the first counter 162, the oscillation circuit 163, and a second counter 164. A digital value of the register 174 and an output value of the first counter 162 are digitally compared in the comparator 161, and if the digital value of the register 174 is greater than the output value of the first counter 162, a high level signal is output. Also, if the digital value of the register 174 is smaller than the output value of the first counter 162, a low level signal is output.

Since the oscillation circuit 163 generates a clock signal of a predetermined period, the number of clocks is counted by the first counter 162. The first counter 162 sequentially outputs the values obtained by counting the clocks from the oscillation circuit 163 to the comparator 161.

Figure 8:
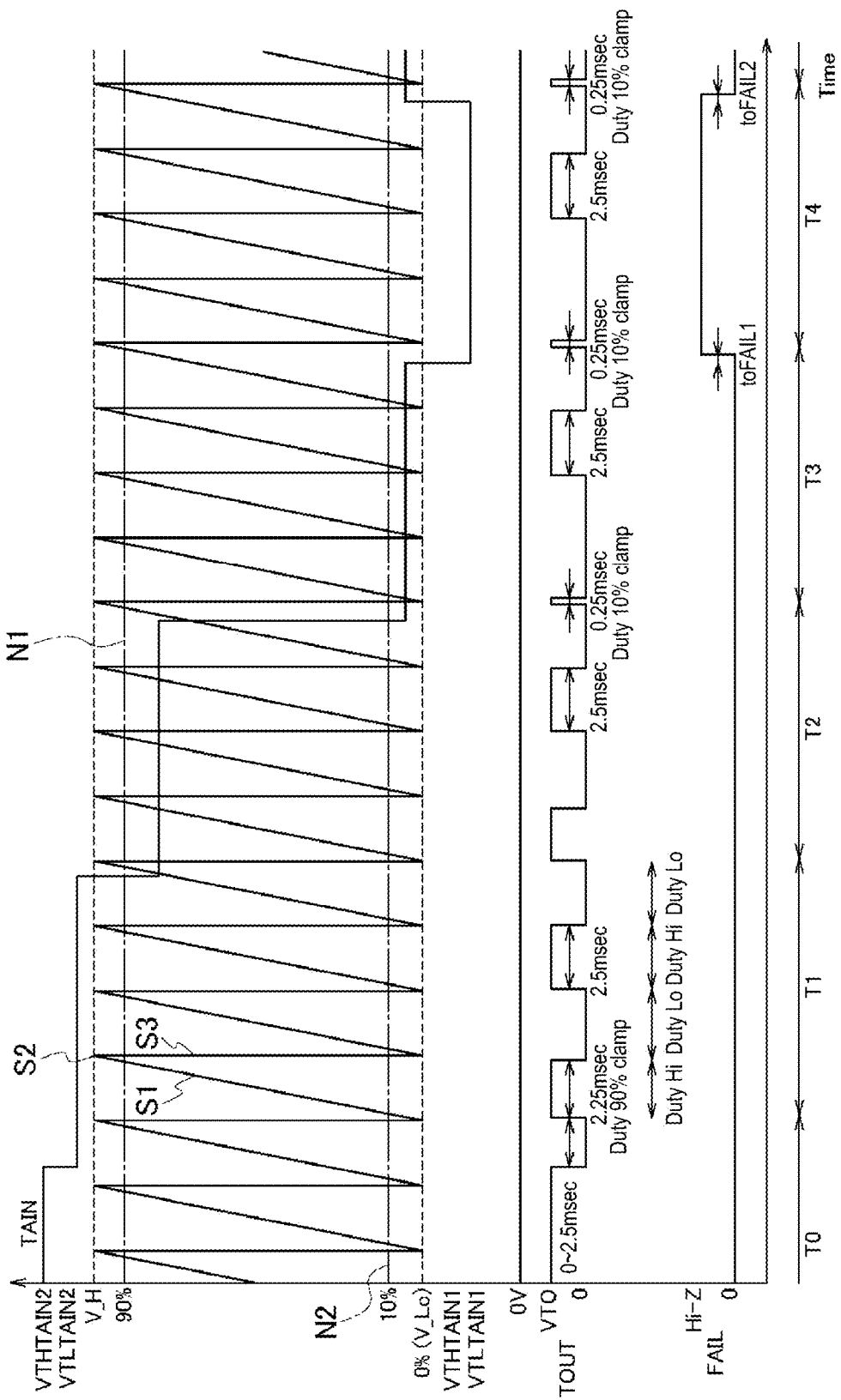
FIG. 8 is a view illustrating a time chart in a digital comparison circuit of the circuit of FIG. 7.

FIG. 8 is a time chart of the digital comparison circuit 200, which mainly shows data compared in the comparator 161 and a time chart of an output from the comparator 161.

A clock from the oscillation circuit 163 is also input to the second counter 164. The second counter 164 is used to cancel an offset of the comparator 173 and set to count up to a digital value equivalent to an offset amount of the comparator 173. If the oscillation circuit 163 operates, the second counter 164 executes counting until such time that it reaches an amount equivalent to the offset of the comparator 173, and outputs a corresponding value to the DA converter 175. The input digital value from the second counter 164 is converted into an analog amount by the DA converter 175 and input to an offset adjustment terminal of the comparator 173. Accordingly, the offset of the comparator 173 is canceled.

A digital value output from the first counter 162 is increased stepwise (e.g., by 1 at a time) by the clock from the oscillation circuit 163, but it is equivalent to a sloped portion 51 of a triangular wave. Meanwhile, the first counter 162 is set to reset a numerical value now into 0 when the numerical value counted by the first counter 162 reaches a maximum value S3 of the triangular wave. Thus, in order to transmit immediately from the maximum value to 0, as shown in S3 of the triangular wave, the value is a straight line without a slope, and the S3 is in a state without a pulse width. In this manner, the triangular wave generation circuit is configured with the first counter 162 and the oscillation circuit 163 and outputs a digital signal equivalent to the analog triangular waveform as a time series.

A digital value of the temperature detection voltage value supplied from the register 174 to the comparator 161 is shown as the TAIN signal in FIG. 8. As shown in FIG. 8, the TAN signal and a count value equivalent to the triangular wave output from the first counter 162 are compared. Here, the period for performing the comparison is determined to include 2 cycles, in which one cycle is composed of a DutyHi period and a DutyLo period, as shown in each period T0 to T4.

The DutyHi period refers to a high-level period in the pulse corresponding to a period from a maximum value to a next maximum value or corresponding to a period from a minimum value to a next minimum value in the triangular wave. The DutyLo period is a next period of the DutyHi period, and refers to a low-level period in the pulse corresponding to a period from a maximum value to a next maximum value or a period from a minimum value to a next minimum value in the triangular wave.

In FIG. 8, the extent that the level of the TAIN signal is changed is illustrated, so it should be noted that the results obtained by comparing the TAIN signal and the triangular wave illustrated in FIG. 8 and the timing of TOUT equivalent to the output signal from the comparator 161 are not consistent.

Specifically, a process of forming the TOUT signal will be described. For example, as shown in FIG. 8, one period starting from a maximum value of the triangular wave to a next maximum value or one period from a minimum value of the triangular wave to a next minimum value may be set to be 2.5 msec.

For example, during the period T1, when TAIN is in the 90% line N1 of the maximum value of the triangular wave, the triangular wave and N1 are compared in the comparator 161, and a high level signal is output during a period in which N1 is higher than the triangular wave and a low level signal is output during a period in which N1 is lower than the triangular wave. Since a first DutyHi period is equivalent to 90% of the period of 2.5 msec, it can be calculated by 2.5×0.9=2.25 msec. This is a pulse period described as a 2.25 msec Duty 90% clamp.

The next DutyLo period has a pulse width of 2.75 msec as the sum of 2.5-2.25=0.25 msec and 2.5 msec. The period T1 includes two DutyHi periods and two DutyLo periods, but during the first DutyHi period and the first DutyLo period, the results obtained by comparing the triangular wave and N1 are output from the comparator 161. During the next DutyHi period and the next DutyLo period, a comparison process is not executed and a pulse of a high level having a width of 2.5 msec and a pulse of a low level having a width of 2.5 msec in a period of the triangular wave are output.

The operation of the period T1 as described above is also executed during T2, T3, and T4. During the period T2, if TAIN is maintained in the state of 90% line N1 of the maximum value of the triangular wave, like the operation during the period T1, a high level pulse having a pulse width of 2.25 msec is output during the first DutyHi period, and a low level pulse having a pulse width of 2.75 msec is output during the first DutyLo period.

During the next DutyHi period and the next DutyLo period, a comparison process is not executed and a pulse of a high level having a width of 2.5 msec and a pulse of a low level having a width of 2.5 msec in a period of the triangular wave are output. This state is illustrated in FIG. 8.

During the period T3, it is described that TAIN is in the state of 10% line N2 of the maximum value of the triangular wave. The triangular wave and N2 are compared in the comparator 161, and a high level signal is output during a period in which N2 is higher than the triangular wave and a low level signal is output during a period in which N2 is lower than the triangular wave. Since the first DutyHi period is equivalent to 10% of the period of 2.5 msec, it can be calculated by 2.5×0.1=0.25 msec. This is a pulse period described as a 0.25 msec Duty 10% clamp.

The next DutyLo period has a pulse width of 4.75 msec as the sum of 2.5-0.25=2.25 msec and 2.5 msec. Further, during the next DutyHi period and the next DutyLo period, a comparison process is not executed and a pulse of a high level having a width of 2.5 msec and a pulse of a low level having a width of 2.5 msec in a period of the triangular wave are output.

During the period T4, since TAIN is maintained in the state of 10% line N2 of the maximum value of the triangular wave, like the operation during the period T3, a high level pulse having a pulse width of 0.25 msec is output during the first DutyHi period, and a low level pulse having a pulse width of 4.75 msec is output during the first DutyLo period. During the next DutyHi period and the next DutyLo period, a comparison process is not executed and a pulse of a high level having a width of 2.5 msec and a pulse of a low level having a width of 2.5 msec in a period of the triangular wave are output.

In this manner, the results obtained by comparing the TAIN, the temperature detection voltage signal of the temperature sensor 121, and the triangular wave by the comparator 161 at every period Tn (n=0~N) are sent to a level shifter 108.

Here, the FAIL signal also present in a connection terminal will be described. For example, in FIG. 8, as shown by a relationship between the triangular wave and the TAIN signal during the period T4, it is an operation where the TAIN signal does not have a portion higher than that of the triangular waveform signal. This indicates that a temperature detected by the temperature sensor 121 is considerably high and the temperature detection voltage signal TAIN is extremely low.

In this case, in order to inform that the temperature rise of the temperature detection target has reached a limit, the comparator 161 outputs a low level signal. The low level signal from the comparator 161 is input to a gate of an N type MOSFET 109. Accordingly, the FET 109 is turned off, and the FAIL terminal is changed to a high level state. The FAIL signal is transmitted to an external control device or the like, so as to be used as a control signal for stopping an operation of the temperature detection target, etc.

A DC voltage level of the output signal from the comparator 161 is converted by the level shifter 108, so a high level signal is converted into a low level signal, and a low level signal is converted into a high level signal. An output from the level shifter 108 is input to a gate of an N type MOSFET 111 and a gate of a P type MOSFET 110.

Since it is configured such that a source of the FET 110 and a drain of the FET 111 are connected and the gate of the FET 110 and the gate of the FET 111 are connected, an inverter is configured with the FET 110 and the FET 111. Thus, an output signal from the level shifter 108 is inverted by the inverter based on the FETs 110 and 111. Accordingly, logically, the output signal from the comparator 161 becomes the TOUT signal as is. In this manner, the temperature detected by the temperature sensor 121 is converted into a pulse width of a pulse signal or a duty ratio and detected. Further, a VTO signal illustrated in FIG. 8 indicates a high level value of the TOUT signal. The TOUT signal is used, for example, to control torque, as a switching frequency, etc.

As described above, in order to obtain the signal with a duty cycle to the comparator, the temperature detection voltage signal is converted into a digital value and the triangular wave as a reference for comparison is formed as a digital signal. Thus, since the comparison process is executed based on the digital values, the maximum value and the minimum value of the triangular wave, the slope of the triangular wave, etc., are not changed like in the case of an analog triangular wave, and a signal with a duty cycle having extremely good precision can be obtained.

Comparative Example

As a comparative example, there is a technique of detecting a temperature of a switching element and cooling an inverter based on the obtained information or measuring a temperature of the switching element or the inverter to limit torque or a switching frequency, in order to avoid damage to the switching element.

In this comparative example, in a PN junction semiconductor element such as a diode, a voltage is changed into a linear form over a temperature change. If a diode as a temperature sensor is installed in the vicinity of the switching element and a voltage is measured, temperature information having high precision and high response can be obtained. If the temperature information having high precision is obtained, torque can be output up to the proximity of a breakdown temperature of the switching element, and high density of the inverter can be expected.

As described above, if the PN junction semiconductor element such as a diode is used as a temperature sensor, a comparator of the temperature detecting circuit compares a temperature detection voltage from a temperature sensor and a triangular wave generated by an analog circuit.

The triangular wave and the temperature detection voltage are compared in the comparator, and, for example, the comparator is configured such that when the temperature detection voltage is higher than the triangular wave, an output from the comparator has a high level, and when the temperature detection voltage is lower than the triangular wave, an output from the comparator has a low level. In addition, since the temperature detection voltage is decreased as the temperature increases, the duty cycle of the pulse signal output from the comparator is changed, and a temperature is prevented from being increased by controlling torque or a switching frequency based on the pulse signal.

For example, if power controlling is performed by using a power switch, a signal with a duty cycle is generated by comparing an analog triangular waveform and a numeral value based on a command value.

Here, however, the output pulse signal from the comparator is determined by comparing the triangular wave and the temperature detection voltage. Thus, in order to enhance precision of the duty cycle of the output pulse signal output from the comparator, a maximum value and a minimum value of the analog triangular wave, and the slope of the triangular wave are required to be generated with good precision.

However, the circuit for generating the analog triangular wave is affected by a temperature change of the outer environment, a change in a power source voltage, etc., and cannot generate a stable analog triangular waveform, so it is difficult to enhance the precision of the duty cycle of the output pulse signal output from the comparator.

The temperature detecting circuit of the second embodiment includes the AD conversion circuit 107, the triangular wave generation circuit (the first counter 162, the oscillator circuit 163), and the comparator 161. The AD conversion circuit 107 is configured to convert a temperature detection signal from the temperature sensor 121 into a digital value. The triangular wave generation circuit is configured to output a digital signal equivalent to a triangular waveform as a time series. The comparator 161 is configured to compare the digital temperature detection signal output from the AD conversion circuit 107 and the digital signal output from the triangular wave generation circuit. Further, a signal with a duty cycle is output from the comparator 161. Thus, since the triangular waveform, as well as the temperature detection signal, is provided as a digital signal, and there is no change in a maximum value and a minimum value of the triangular waveform, the slope of the triangular waveform, etc., a duty output signal having good precision can be obtained.

Third Embodiment

Hereinafter, a third embodiment of the present disclosure will be described in detail with reference to FIGS. 9 to 11.

A power semiconductor module 77 of the third embodiment includes a power element circuit configured by a power switching element (IGBT), a temperature detecting diode (i.e., a temperature sensor) 35 for measuring the temperature of the power switching element, and a temperature detecting circuit 77a for detecting a temperature by a voltage signal from the temperature detecting diode 35. In addition, the temperature detecting diode 35 and the temperature detecting circuit 77a are formed on a single chip by an SOI structure.

Further, the chip and the power element circuit are formed on a common frame and installed in a single package.

Figure 9:
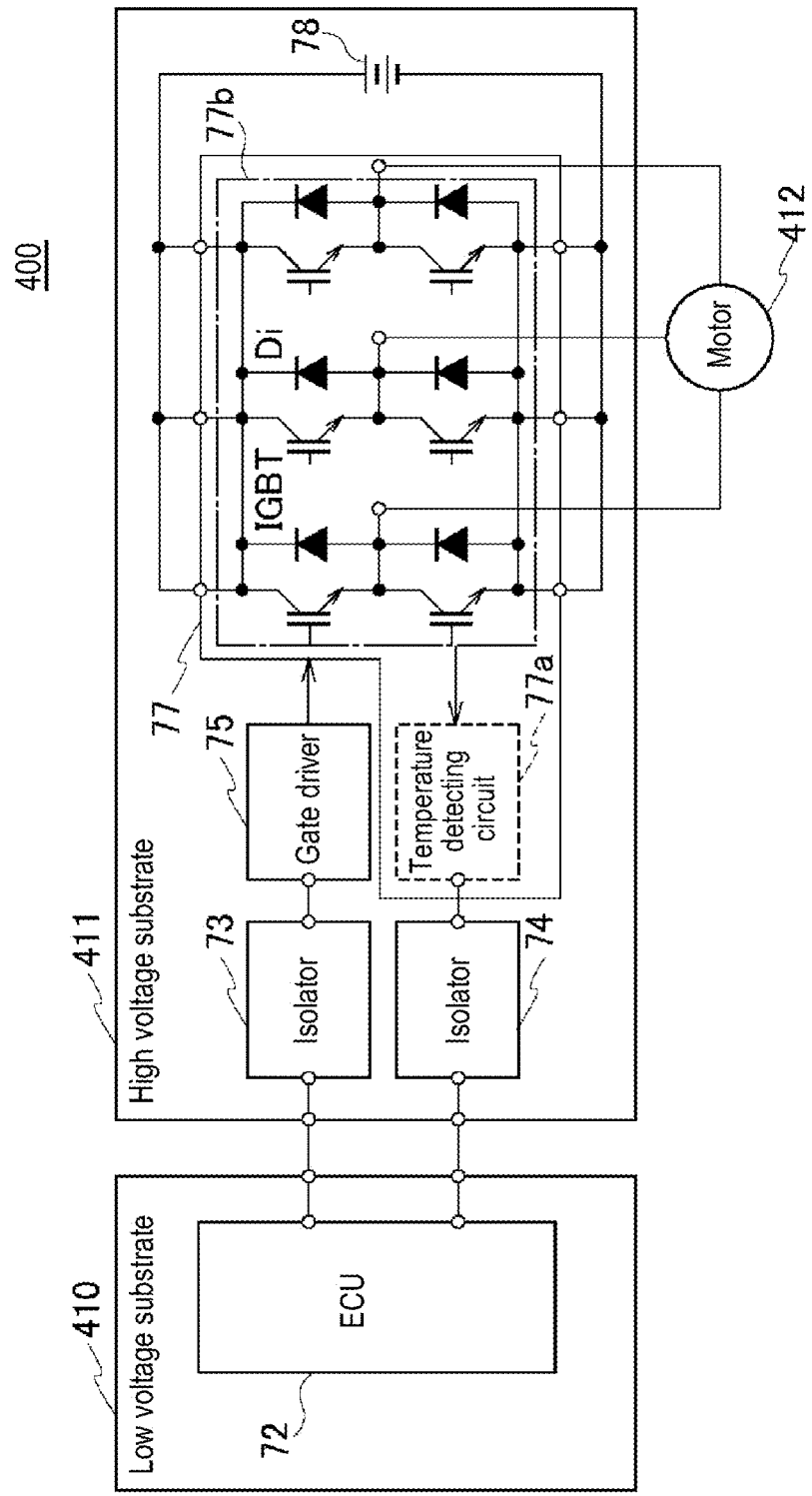
FIG. 9 is a view illustrating a block configuration of a driving type device using a power semiconductor module of a third embodiment.

FIG. 9 illustrates an example of a driving system apparatus 400 in which signals are transmitted in both directions between a low voltage substrate 410 and a high voltage substrate 411 of an automobile. The low voltage substrate 410 is mainly configured by an ECU 72. ECU is called an electronic control unit or an engine control unit, which executes controlling of an engine, controlling of a driving system or a steering system, etc., by a computer.

The high voltage substrate 411 includes the power semiconductor module 77 having an inverter circuit 77b for driving a motor 412. The power semiconductor module 77 is formed as a single package, in which the temperature detecting circuit 77a and the inverter circuit 77b are formed. An insulating gate bipolar transistor (IGBT) is illustrated as a power switching element of the inverter circuit 77b. A gate of each IGBT is connected to a gate driver 75, and a flywheel diode is connected in parallel to each IGBT. A DC voltage is supplied from a DC power source 78 to each IGBT.

A control signal output from the ECU 72 is transmitted to a gate driver 75 through an isolator 73. A driving signal from the gate driver 75 is output according to the control signal from the ECU 72. PWM controlling is performed by the driving signal, and six IGBTs of the inverter circuit 77b are turned on or off at a desired timing to generate 3-phase AC power for driving the motor 412.

Meanwhile, the temperature is detected by a temperature sensor (not shown) based on a diode installed in the vicinity of the IGBTs of the inverter circuit 77b, and the detected signal is input to the temperature detecting circuit 77a and converted into a pulse signal so as to be output and transmitted to the ECU 72 through an isolator 74. As the isolators 73 and 74, a photocoupler or an insulating transformer is used.

In this configuration, the temperature detecting circuit 77a and the temperature sensor 35 based on a diode are made into one chip by using an HT-SOI (Silicon on Insulator) structure in manufacturing a semiconductor stacked structure. The SOI structure is a technique of forming a thin insulating oxide film on a silicon substrate and further forming an electric circuit such as a transistor, a sensor, etc. thereon. This technique has a fast speed and high power characteristics with low power consumption in comparison to a general bulk CMOS technique. A junction temperature in the SOI structure is 225 degrees Celsius, and by executing one chip based on the SOI structure, stable temperature detection with high precision can be executed.

Further, the temperature sensor 35 and the temperature detecting circuit 77a configured as one chip based on the SOI structure are installed in the same package with the inverter circuit 77b. That is, the chip of the inverter circuit 77b and the chip of the temperature detecting circuit 77a including a temperature sensor are disposed on the same frame. Thus, the precision of temperature detection can be further improved.

Figure 10:
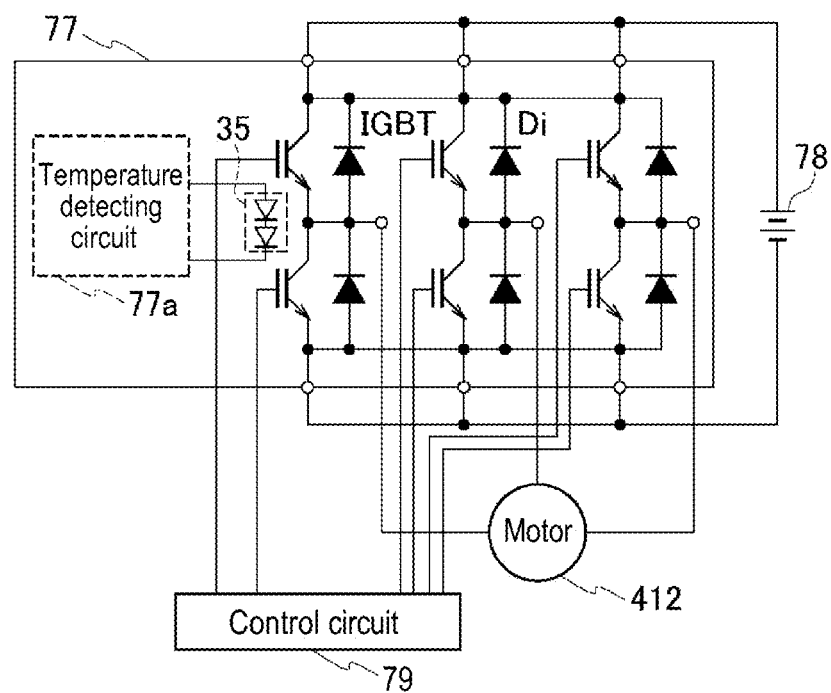
FIG. 10 is a view illustrating a circuit configuration of the power semiconductor module of the third embodiment.

FIG. 10 illustrates a position of the disposition of the temperature sensor 35 configured as a diode in the power semiconductor module 77 of FIG. 9. The temperature sensor 35 is installed in the vicinity of the IGBT. Further, the temperature sensor 35 is configured to include two diodes connected in series. The diodes as the temperature sensor have the characteristic that a forward voltage is reduced when the temperature is increased under the condition of a constant current. The temperature of a switching element such as a power transistor may be measured by supplying a predetermined current to the diode and measuring a forward voltage.

Further, in FIG. 10, it is illustrated that the temperature detecting circuit 77a and the temperature sensor 35 are separated, which makes understanding the disposition position of the temperature detecting diode easier, and as described above, the temperature detecting diode and the temperature detecting circuit 77a are made into one chip by the SOI structure. Meanwhile, a control circuit 79 is installed as a circuit which outputs a control signal and includes a function of the gate driver 75 of FIG. 9.

Figure 11:
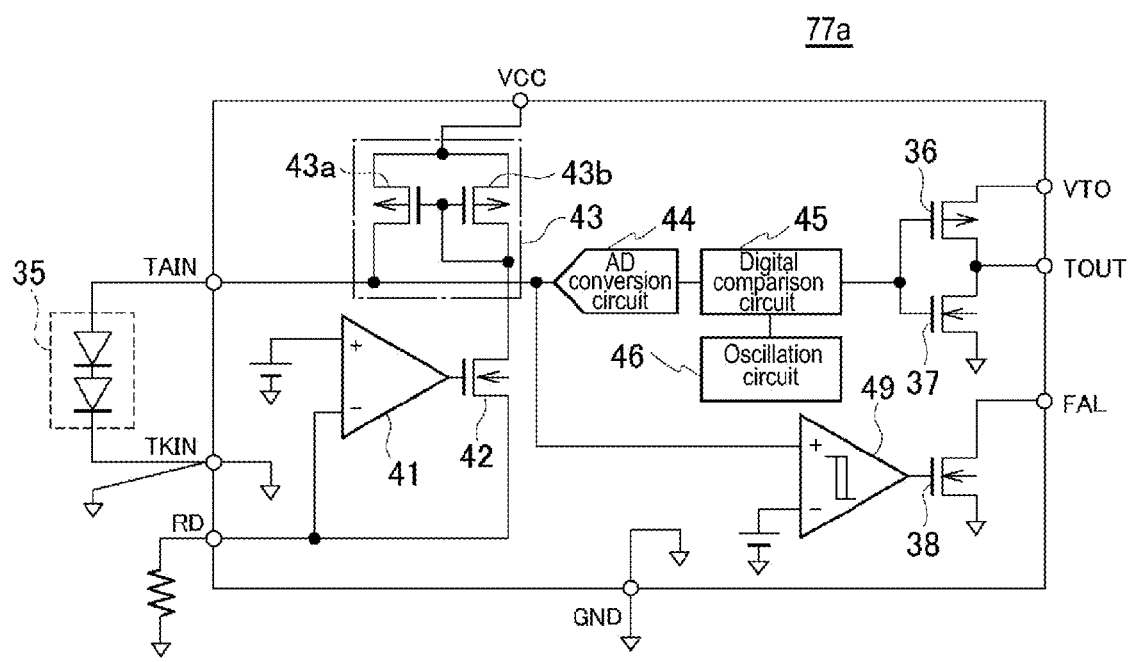
FIG. 11 is a view illustrating a circuit configuration example of a temperature detecting circuit of the third embodiment.

Next, a circuit configuration example of the temperature detecting circuit 77a illustrated in FIGS. 9 and 10 is shown in FIG. 11. As described above, since there is a need to make a constant current flow to the diodes of the temperature sensor 35, a constant current source includes an amplifier 41 functioning as an operational amplifier, a FET 42, and a current mirror circuit 43. The current mirror circuit 43 includes P type MOSFETs 43a and 43b. A gate of the FET 43a and a gate of the FET 43b are connected, and a drain of the FET 43a and a drain of the FET 43b are also connected. The FET 43b is also connected to a diode.

If a current flowing between the drain and a source of the FET 43b is determined, a current flowing between the drain and a source of the FET 43a is also determined. The amplifier 41 and the N type MOSFET 42 constitute a power amplifier.

A temperature detection voltage TAIN detected by the temperature sensor 35 is input to an AD conversion circuit 44. The AD conversion circuit 44 is configured as a so-called sequential comparison AD conversion circuit. The TAIN signal converted into a digital value in the AD conversion circuit 44 is input to a digital comparison circuit 45.

The digital comparison circuit 45 is configured as a counter, a digital comparator, or the like. An oscillation circuit 46 generates a clock pulse of a predetermined frequency, and the clocks from the oscillation circuit 46 are counted by a counter within the digital comparison circuit 45 to generate a digital triangular signal. The digital comparison circuit 45 includes a digital comparator to compare the digital triangular signal and the TAIN signal which has been converted into a digital value. When the TAIN signal having a digital value is greater than the digital triangular signal, the digital comparison circuit 45 outputs a high level signal. When the TAIN signal having a digital value is smaller than the digital triangular signal, the digital comparison circuit 45 outputs a low level signal.

The output signal from the digital comparison circuit 45 is then output to an inverter circuit. The inverter circuit includes an N type MOSFET 37 and a P type MOSFET 36. A source of the FET 36 and a drain of the FET 37 are connected, and a gate of the FET 36 and a gate of the FET 37 are also connected. An output signal from the digital comparison circuit 45 is input to the gate of the FET 36 and the gate of the FET 37.

The output signal from the digital comparison circuit 45 is inverted by the inverter according to the FETs 36 and 37 so as to be output as a TOUT signal. Further, a signal of a terminal VTO indicates a high level value of the TOUT signal. Thus, the size of the temperature from the temperature sensor 35 is detected by a pulse width of the TOUT signal or by a signal with a duty cycle.

Here, a FAL signal also included in a connection terminal will be described. The FAL signal indicates that temperature detected by the temperature sensor 35 is considerably high, while the temperature detection voltage signal TAIN is extremely low. That is, the FAL signal is generated when the temperature detected by the temperature sensor 35 reaches a limit value.

A DC power source is connected to a minus terminal of a comparator 49. A voltage value of the DC power source is set to be a voltage corresponding to the limit value of the temperature. Meanwhile, the temperature detection voltage signal TAIN is input to a plus terminal of the comparator 49. When the temperature detection voltage signal TAIN is higher than a voltage value of the DC power source, a high level signal is output from the comparator 49. The high level signal from the comparator 49 is input to the gate of the N type MOSFET 38. Accordingly, the FET 38 is turned on and the FAL terminal has a low level.

Meanwhile, when the detected temperature is decreased and so the temperature detection voltage signal TAIN becomes lower than the voltage value of the DC power source, the output from the comparator 49 is reversed into a low level signal. The low level signal from the comparator 49 is input to the gate of the N type MOSFET 38. Accordingly, the FET 38 is turned off and the FAL terminal has a high level. In this manner, it is informed that a temperature rise of the temperature detection target has reached a limit. The FAL signal is transmitted to an external control device or the like, and used as a control signal for stopping an operation of the temperature detection target, etc.

Comparative Example

As a comparative example, in a system such as a 3-phase inverter, the temperature of each phase IGBT element is increased according to an operational state of the motor, such as a motor locked state, and thus, there is a possibility of a breakdown. In this configuration, the 3-phase inverter drives an electric motor by using an insulated gate bipolar transistor (IGBT), which is a power switching element. For this reason, the temperature of each IGBT element is monitored, and when a monitored temperature is higher than a predetermined temperature, in general, an output power of the inverter and a driving frequency of the IGBT element are reduced, thus restraining a temperature rise.

Further, in the comparative example, the inverter circuit and the temperature detecting diode are mounted on the same substrate and configured as chips, and when the IGBT of the inverter circuit is operated, temperature detection is executed. However, in this configuration, since the temperature detecting diode and the temperature detecting circuits are formed as separate chips, detection precision is degraded due to an influence of non-uniformity between the semiconductor elements.

In addition, in making chips with the related art silicon semiconductor, a usage limit temperature (junction temperature) is 150 degrees Celsius, so it is difficult to form the temperature detecting diode and the temperature detecting circuit as a single chip.

The third embodiment includes the power element circuit configured by the power switching element, the temperature detecting diode 35 installed to measure the temperature of the power switching element, and the temperature detecting circuit 77a for detecting the temperature by a voltage signal from the temperature detecting diode 35. Further, the temperature detecting diode 35 and the temperature detecting circuit 77a are formed on a single chip by the SOI structure. Thus, a junction temperature can be increased, relative precision between the semiconductor elements of the temperature detecting circuit 77a and the temperature detecting diode 35 can be improved, and temperature detection of high precision can be executed.

According to the present disclosure, in some embodiments, it is possible to provide a temperature detecting apparatus capable of forming a temperature detecting circuit and an insulating element on the same substrate and reduce the size of an overall apparatus.

Further, according to the present disclosure, in some embodiments, it is possible to provide a temperature detecting circuit capable of increasing the degree of precision of a duty cycle with an output pulse signal that can be employed for controlling a temperature rise, etc.

Additionally, according to the present disclosure, in some embodiments, it is possible to provide a power semiconductor module capable of forming a temperature detecting diode and a temperature detecting circuit as one chip and increasing the degree of precision in detecting temperature.

According to the present disclosure, in some embodiments, the temperature detecting apparatus and the temperature detecting circuit of the present disclosure can be applied to detect the temperature of a power device such as an inverter, a switching element or the like, having a high temperature state.

Further, according to the present disclosure, in some embodiments, the power semiconductor module of the present disclosure can be applied to any power device using high voltage, such as a hybrid vehicle, an electric vehicle, a home appliance, an industrial device, etc.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor package, comprising:
   a first chip;
   a second chip; and
   a third chip electrically connected to the second chip,
   the first chip comprising:
      an AD conversion circuit configured to convert a temperature detection signal from a temperature sensor into a digital temperature detection signal;
      a triangular wave generation circuit configured to output a digital signal equivalent to a triangular waveform as a time series, the triangular wave generation circuit including one selected from a group consisting of CMOS logic and TTL logic; and
      a digital comparator configured to compare the digital temperature detection signal output from the AD conversion circuit and the digital signal output from the triangular wave generation circuit and output a signal with a duty cycle, the second chip comprising:
an insulating transformer configured to transmit a pulse signal to an integrated circuit which is operated by an operation voltage different from that of the first chip, the pulse signal being generated based on the signal with a duty cycle,
the third chip comprising a signal demodulation circuit,
wherein the first chip and the second chip are mounted on a common substrate, electrically connected to each other, and covered by a resin part,
wherein the third chip is mounted on another substrate different from the common substrate where the first chip and the second chip are mounted,
wherein the second chip is disposed between the first chip and the third chip, and
wherein the first chip, the second chip, and the third chip are commonly covered by the resin part.

2. The semiconductor package of claim 1, wherein a period for executing the comparison process in the digital comparator comprises four cycles including a first two cycles, a third cycle and a fourth cycle, in which one cycle is defined as a section from a maximum value of the triangular waveform to a next maximum value of the triangular waveform or a section from a minimum value of the triangular waveform to a next minimum value of the triangular waveform.

3. The semiconductor package of claim 2, wherein a duty ratio is determined by the first two cycles during one period for executing the comparison process.

4. The semiconductor package of claim 1, wherein when a temperature detected by the temperature sensor reaches a limit value, a detection signal is output from the digital comparator.

5. The semiconductor package of claim 1, wherein the temperature sensor comprises an element configured to operate with a constant current, the voltage of the element changing in response to a temperature.

6. The semiconductor package of claim 5, wherein a constant current source includes a current mirror circuit, and wherein the constant current source is configured to flow a current to the temperature sensor and change the current flowing to the temperature sensor based on a value of a resistor connected to the current mirror circuit.

7. The semiconductor package of claim 1, wherein the triangular wave generation circuit has an oscillation circuit which generates a clock signal of a predetermined period, and the digital signal is generated based on the clock signal.

8. The semiconductor package of claim 1, wherein a plastic mold is formed at a portion between the insulating transformer and the signal demodulation circuit.

9. The semiconductor package of claim 1, wherein a copper island is formed on a rear surface of the common substrate,
wherein a bonding pad is formed on the copper island, and
wherein a copper coil is formed at an inner side of the copper island.

10. A semiconductor package, comprising:
a first chips;
a second chip; and
a third chip electrically connected to the second chip,
the first chip comprising:
an AD conversion circuit configured to convert a analog signal detected by a temperature sensor into a digital signal; and
a digital comparator configured to compare the digital signal with a digital triangular wave signal, and output a signal with a duty cycle as a result of the comparison, the second chip comprising:
an insulating transformer configured to transmit a pulse signal to an integrated circuit which is operated by an operation voltage different from that of the first chip, the pulse signal being generated based on the signal with a duty cycle,
the third chip comprising a signal demodulation circuit, and
wherein the first chip and the second chip are mounted on a common substrate, electrically connected to each other, and covered by a resin part,
wherein the third chip is mounted on another substrate different from the common substrate where the first chip and the second chip are mounted,
wherein the second chip is disposed between the first chip and the third chip,
wherein the first chip, the second chip, and the third chip are commonly covered by the resin part.

11. The semiconductor package of claim 10, wherein the digital comparator has an oscillation circuit which generates a clock signal of a predetermined period and the digital triangular wave signal is generated based on the clock signal.

12. The semiconductor package of claim 11, wherein the digital comparator has a counter which counts the number of the clock signal generated by the oscillation circuit; and
the digital triangular wave signal is determined by the total of the number of the clock signal.

13. The semiconductor package of claim 10 further comprising:
a constant current source configured to flow a current to the temperature sensor by a current mirror circuit.

14. The semiconductor package of claim 10, wherein a plastic mold is formed at a portion between the insulating transformer and the signal demodulation circuit.

15. The semiconductor package of claim 10, wherein a copper island is formed on a rear surface of the common substrate,
wherein a bonding pad is formed on the copper island, and
wherein a copper coil is formed at an inner side of the copper island.

* * * * *